(12) United States Patent
Ikeda et al.

(10) Patent No.: US 8,754,420 B2
(45) Date of Patent: Jun. 17, 2014

(54) SEMICONDUCTOR DEVICE

(75) Inventors: Kentaro Ikeda, Kanagawa (JP);
Mayumi Morizuka, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 177 days.

(21) Appl. No.: 13/397,887

(22) Filed: Feb. 16, 2012

(65) Prior Publication Data
US 2013/0062611 A1    Mar. 14, 2013

(30) Foreign Application Priority Data

Sep. 8, 2011  (JP) ................................ 2011-196149

(51) Int. Cl.
*H01L 29/76*  (2006.01)
(52) U.S. Cl.
USPC ....................... 257/76; 257/E21.46
(58) Field of Classification Search
USPC ................ 257/E29.143, E29.046, E21.62
See application file for complete search history.

(56) References Cited

U.S. PATENT DOCUMENTS 5,471,075 A * 11/1995 Shekar et al. ................ 257/139
7,449,730 B2   11/2008 Kuraguchi 2002/0024056 A1 * 2/2002 Miyakoshi et al. .......... 257/144
2010/0207166 A1 * 8/2010 Zhu ............................... 257/201
2012/0205739 A1 * 8/2012 Yamashita .................... 257/335

FOREIGN PATENT DOCUMENTS

JP     2007-180454     7/2007

* cited by examiner

*Primary Examiner* — Thao P Le
(74) *Attorney, Agent, or Firm* — Oblon, Spivak, McClelland, Maier & Neustadt, L.L.P.

(57) ABSTRACT

A semiconductor device of an embodiment includes: a first semiconductor layer made of $Al_xGa_{1-x}N$ ($0<x<1$) or $In_yAl_{1-y}N$ ($0\leq y\leq 1$); a first semiconductor region, an insulating film, and an anode electrode that are formed on the same plane of the first semiconductor layer, and are made of undoped, n-type, or p-type GaN; and a cathode electrode formed on the first semiconductor region. In this semiconductor device, the first semiconductor region, the insulating film, and the anode electrode are joined to the first semiconductor layer. The insulating film is joined to the first semiconductor layer between the first semiconductor region and the anode electrode. The junction between the anode electrode and the first semiconductor layer is an ohmic junction. The junction between the cathode electrode and the first semiconductor region is an ohmic junction.

10 Claims, 5 Drawing Sheets

SEMICONDUCTOR DEVICE

CROSS-REFERENCE TO RELATED APPLICATION

This application is based upon and claims the benefit of priority from Japanese Patent Application No. 2011-196149, filed on Sep. 8, 2011; the entire contents of which are incorporated herein by reference.

FIELD

Embodiments described herein relate generally to a semiconductor device.

BACKGROUND

A nitride semiconductor is characteristically a wide bandgap semiconductor. A wide bandgap semiconductor normally has high withstand voltage and low resistance. Therefore, attention is drawn to nitride semiconductors as devices for the next-generation power electronics. Typical devices for power electronics are FETs and diodes, and nitride semiconductors are being actively developed for FETs and diodes.

There is a type of nitride semiconductor that uses a hetero junction. When an AlGaN layer, an InAlN layer, or the like is formed on GaN, an electron channel called a two-dimensional electron gas is formed at the interface between the GaN and the AlGaN or InAlN. As the two-dimensional electron gas has high electron mobility, devices that have low resistance and are capable of high-speed operations can be produced. Accordingly, with nitride semiconductors, power devices having hetero structures are often formed.

Since only electrons that are majority carriers serve as carriers in a Schottky barrier diode that is a type of diode, such a diode excels in high-speed characteristics. It is said that the on-state voltage of a diode is generally low. A Schottky junction is formed by bringing a semiconductor into a Schottky metal, to form a Schottky barrier. In this manner, a rectifying operation is realized. The withstand voltage of a Si Schottky barrier diode is low. In a case where a Schottky barrier diode is manufactured with a wide-gap semiconductor, however, a device with a high withstand voltage can be formed because of its physicality. Still, the Schottky barrier of a wide-gap semiconductor is often higher than the Schottky barrier of Si, and the on-state voltage becomes as high as approximately 1 V, for example. A high on-state voltage implies that the conduction loss at the time of current flow in the diode is large. Therefore, in the case of a Schottky barrier diode, the on-state voltage is preferably low. In a case where a metal with a small work function is used as a Schottky metal to lower the on-state voltage, on the other hand, the leakage current increases, though the on-state voltage can be lowered.

DETAILED DESCRIPTION

A semiconductor device of an embodiment includes: a first semiconductor layer made of $Al_xGa_{1-x}N$ (0<x<1) or $In_yAl_{1-y}N$ (0≤y≤1); a first semiconductor region, an insulating film, and an anode electrode that are formed on the same plane of the first semiconductor layer, and are made of undoped, n-type, or p-type GaN; and a cathode electrode formed on the first semiconductor region. In this semiconductor device, the first semiconductor region, the insulating film, and the anode electrode are joined to the first semiconductor layer. The insulating film is joined to the first semiconductor layer between the first semiconductor region and the anode electrode. The junction between the anode electrode and the first semiconductor layer is an ohmic junction. The junction between the cathode electrode and the first semiconductor region is an ohmic junction.

Embodiments of the invention will be described below with reference to the drawings.

Semiconductor devices according to the embodiments will be described below with reference to the accompanying drawings.

(First Embodiment)

Figure 1:
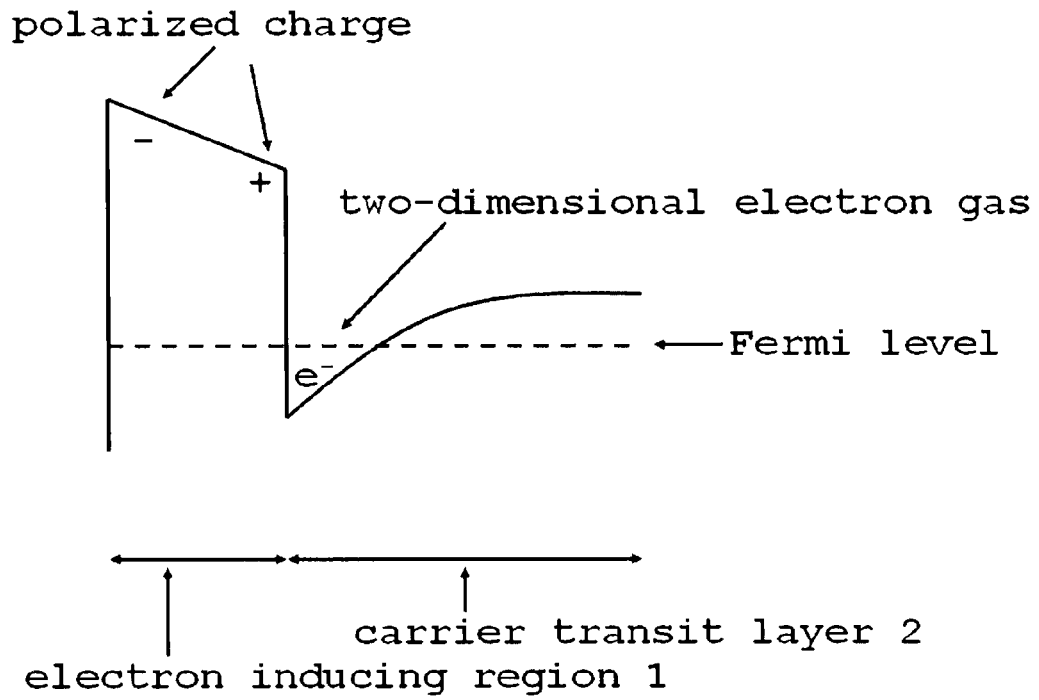
FIG. 1 is a schematic view showing the energy state of a nitride semiconductor having a hetero junction.

FIG. 1 is a schematic view showing the energy state of a nitride semiconductor having a hetero junction. By forming a hetero junction between an electron inducing region 1 and a carrier transit layer 2, a quantum well that is distributed in a flat plane and has a lower energy level than the Fermi level is formed at the interface between the electron inducing region 1 and the carrier transit layer 2. This well has a lower energy level than the Fermi level, and accordingly, a channel is formed with electrons. This channel is called a two-dimensional electron gas, and the electrons in the two-dimensional electron gas have extremely high mobility. The nitride semiconductor having a hetero junction uses this two-dimensional electron gas as the channel.

Figure 2:
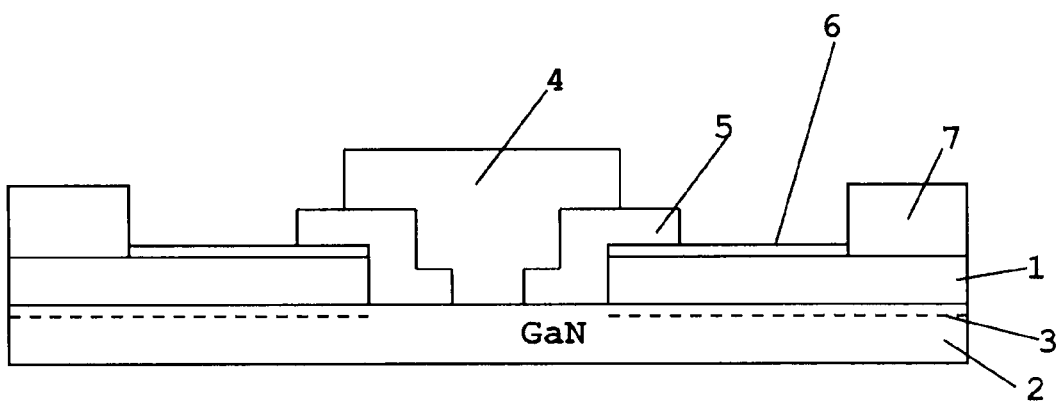
FIG. 2 is a schematic view of a semiconductor device according to an embodiment.

FIG. 2 is a schematic view of a semiconductor device of this embodiment. The semiconductor device of this embodiment has the first electron inducing region 1 (a first semiconductor region), an anode electrode 4, and an insulating film 5 formed on the carrier transit layer 2 (a first semiconductor layer), and has a cathode electrode 7 formed on the first electron inducing region 1. To stabilize the first electron inducing region 1 chemically or geometrically in terms of the form of the surface, a passivation film 6 may be formed on the first electron inducing region 1. A two-dimensional electron gas 3 exists in a region near the dotted-line area in the carrier transit layer 2 located immediately below the first electron inducing region 1. The insulating film 5 is formed between the anode electrode 4 and the first electron inducing region 1 on the carrier transit layer 2. With this arrangement, the semiconductor device can be switched off.

In the semiconductor device of this embodiment, the portion of the first electron inducing region 1 located immediately below the anode electrode 4 is completely removed. The insulating film 5 is formed at least in a region that is located between the anode electrode 4 and the first electron inducing region 1 and is joined to the carrier transit layer 2. Accordingly, there is a region where the insulating film 5 is in contact with the carrier transit layer 2. As a result, the two-dimensional electron gas 3 does not exist in that region either, and a depletion layer exists instead.

The region for the insulating film 5 to be formed on the carrier transit layer 2 can be formed by completely removing the portion of the first electron inducing region 1 located immediately below the anode electrode 4. This feature facilitates the control on recess formation, compared with a method by which part of the first electron inducing region 1 is left in accordance with a designed value. As the insulating film 5, $SiO_2$, SiN, $Al_2O_3$, $TiO_2$, $BaTiO_3$, $SrTiO_3$, (Ba,Sr)$TiO_3$, $Ta_2O_5$, $LiTaO_3$, $HfO_2$, $ZrO_2$, or the like can be used. As the electron inducing region 1, $Al_xGa_{1-x}N$ (0<x≤1) or $In_yAl_{1-y}N$ (0≤y≤1) is typically used. As the carrier transit layer 2, undoped GaN is typically used. The anode electrode 4 and the cathode electrode 7 form an ohmic junction. Since the anode electrode 4 and the cathode electrode 7 form an ohmic junction, the same metal can be used for both electrodes, and the number of manufacturing procedures can be reduced accordingly. In a method of forming a Schottky metal as the anode electrode or a method of forming a general Schottky barrier diode, different metals are used for the anode electrode and the cathode electrode, and therefore, the number of manufacturing procedures becomes increases.

A smaller potential than that applied to the cathode electrode 7, or a reverse bias, is applied to the anode electrode 4, for example. At this point, the depletion layer existing at the interface between the insulating film 5 and the carrier transit layer 2 extends toward the cathode electrode 7. Therefore, no channels exist immediately below the depletion layer and the insulating film 5 in the first place, even if a reverse bias is applied. Accordingly, the leakage current becomes very small. A higher voltage than that applied to the cathode electrode 7, or a forward bias, is applied to the anode electrode 4, for example. As a positive bias is applied to the anode electrode 4, the energy state of the portion located immediately below the insulating film 5 is lowered, and an inversion layer is formed. As a result, an electron channel is formed. The anode electrode 4 is then put into electrical contact with the two-dimensional electron gas 3, and the diode is put into an ON state. As a result, current flows. In the nitride semiconductor, the voltage at which an inversion layer is formed is close to 0 V, and therefore, the on-state voltage is also close to 0 V. Accordingly, a diode with a low on-state voltage can be provided.

As in the schematic view in FIG. 1, the insulating film 5 is formed on the first electron inducing region 1, and the anode electrode 4 is formed on the region where the insulating film 5 is formed on the first electron inducing region 1. With this structure, the withstand voltage of the semiconductor device preferably becomes higher.

Also, in this embodiment, the physical distance between the gate and the source is shorter than in a case where a FET is used as a diode or where a diode operation is realized by short-circuiting the gate and the source of a FET. Accordingly, the parasitic capacitance can be reduced.

(Second Embodiment)

Figure 3:
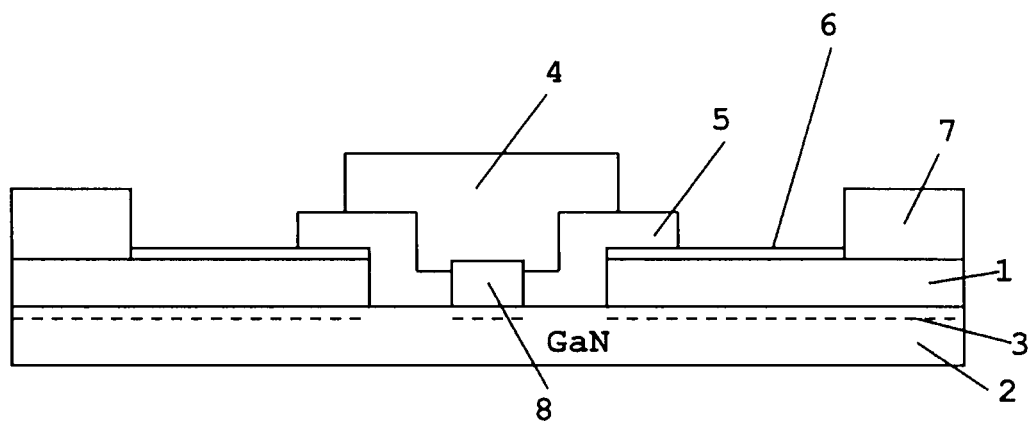
FIG. 3 is a schematic view of a semiconductor device according to another embodiment.

FIG. 3 is a schematic view of a semiconductor device according to a second embodiment. The anode electrode 4 is joined to the carrier transit layer 2 via a second electron inducing region 8. This embodiment differs from the first embodiment in that the anode electrode 4 forms an ohmic junction with the carrier transit layer 2 via the second electron inducing region 8 (a second semiconductor region). The second electron inducing region 8 may be formed by removing part of the first electron inducing region 1 so as to leave the second electron inducing region 8. Alternatively, the second electron inducing region 8 may be formed by an independent process. To simplify the manufacturing process and lower the costs, the second electron inducing region 8 is preferably formed by the former method. The second electron inducing region 8 is formed between the anode electrode 4 and the carrier transit layer 2. No electron channels are formed at the interface between the insulating film 5 and the carrier transit layer 2, as in the first embodiment. However, a two-dimensional electron gas exists in a region near the dotted-line area located immediately below the second electron inducing region 8 in contact with the anode electrode 4. As the two-dimensional electron gas 3 enables the anode electrode 4 to form a more preferable ohmic junction, the on-state resistance of the diode can be lowered.

(Third Embodiment)

Figure 4:
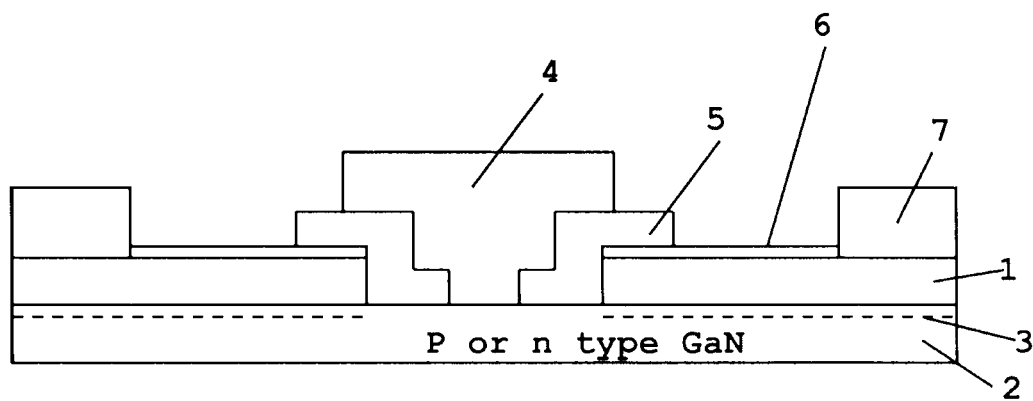
FIG. 4 is a schematic view of a semiconductor device according to yet another embodiment.

FIG. 4 is a schematic view of a semiconductor device according to a third embodiment. This embodiment differs from the first embodiment in that p-type GaN is used as the electron transit layer 2. By using p-type GaN as the electron transit layer 2, the energy state of the portion of the carrier transit layer 2 located immediately below the insulating film 5 is made higher, and the on-state voltage becomes higher. To form a p-type GaN layer, $1 \times 10^{15}$ to $1 \times 10^{18}$ of an impurity such as C or Mg is contained in a GaN layer, for example.

By intentionally increasing the on-state voltage by the doping with a p-type impurity, a low voltage equivalent to an on-state voltage can be obtained through forward bias application. This is equivalent to a Zener diode, and has the advantage that an equivalent of a Zener diode can be provided by a nitride semiconductor that does not easily provide a Zener diode.

(Modification of Third Embodiment)

Figure 5:
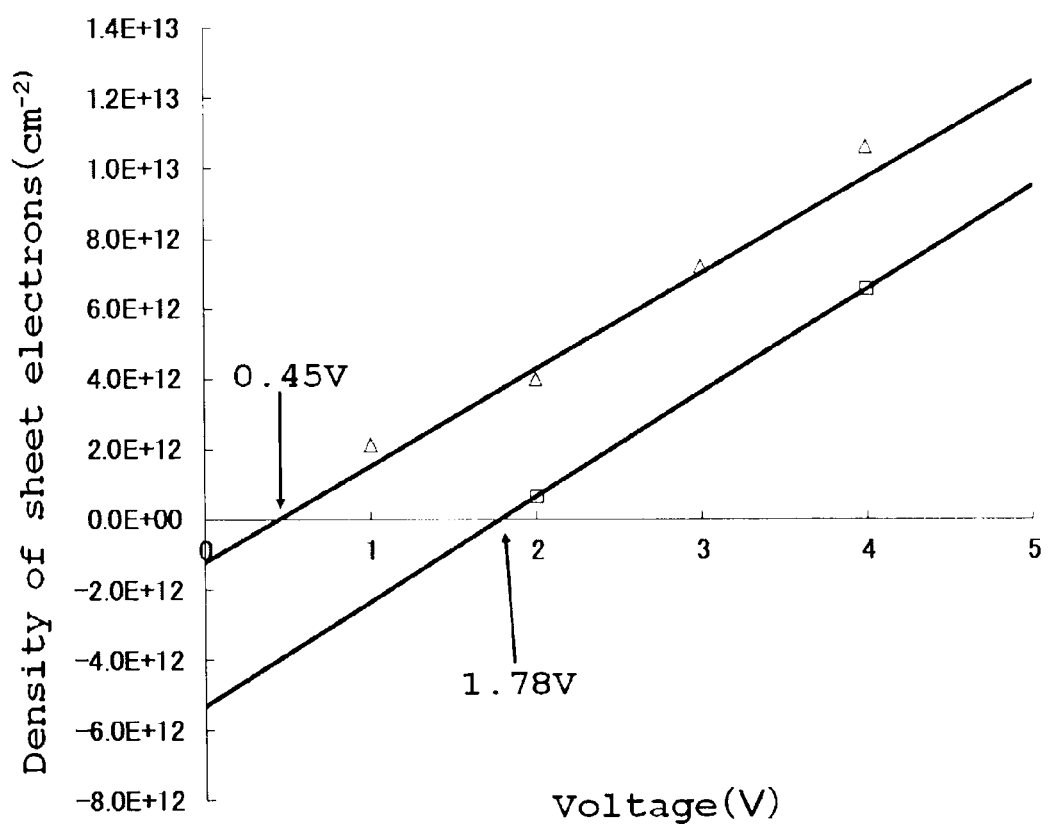
FIG. 5 shows the results of simulations of control operations performed on on-state voltages by adjusting density of sheet electrons.

A semiconductor device according to a modification of the third embodiment differs from the third embodiment in that n-type GaN is used as the carrier transit layer 2. With this structure, the on-state voltage can be lowered, though the on-state voltage is made higher in the third embodiment. By using the structures of the third embodiment and the modification thereof, the on-state voltages of diodes can be easily controlled. FIG. 5 shows the control on the on-state voltage by adjusting the doping concentration of the n-type impurity. As the n-type impurity, $1 \times 10^{15}$ to $1 \times 10^{18}$ of Si or the like can be contained in the carrier transit layer 2, for example.

The line graph plotted with triangular points represents the data obtained where the n-type impurity concentration is $2 \times 10^{16}$, and the line graph plotted with rectangular points represents the data obtained where the n-type impurity concentration is $1 \times 10^{16}$. In FIG. 5, the abscissa axis indicates the forward voltage (V) to be applied to the diode, and the ordinate axis indicates the density ($cm^{-2}$) of sheet electrons existing in the portion of the carrier transit layer 2 located immediately below the insulating film 5. As can be seen from FIG. 5, electrons appear in the portion of the carrier transit layer 2 located immediately below the insulating film 5, if forward voltage application is continued. This implies that an inversion layer is formed, and that the diode is in a conduction state. A simulation is performed on an electron density at an applied voltage. The voltage at which the electron density becomes zero where the extrapolation line is drawn can be the on-state voltage of the diode. When the concentration of the n-type impurity is $1 \times 10^{16}$, the on-state voltage is 1.78 V. However, when the concentration of the n-type impurity is increased to $2 \times 10^{16}$, the on-state voltage drops to 0.45 V. This shows that the on-state voltage can be controlled by adjusting the impurity concentration.

(Fourth Embodiment)

Figure 6:
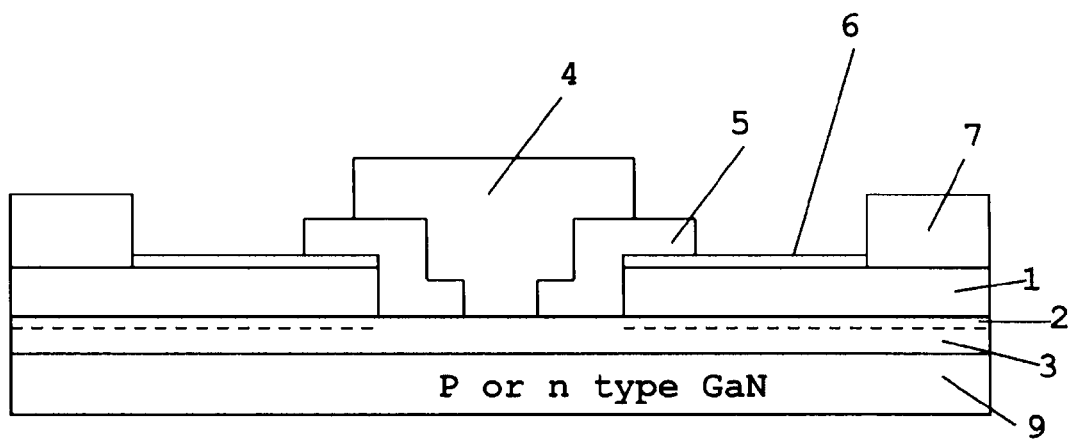
FIG. 6 is a schematic view of a semiconductor device according to still another embodiment.

FIG. 6 is a schematic view of a semiconductor device according to a fourth embodiment. A second semiconductor layer (an on-state voltage control layer 9) made of n- or p-type GaN is formed on the face of the carrier transit layer 2 on the opposite side from the face on which the first electron inducing region 1 is formed (the lower face of the carrier transit layer 2 in FIG. 6). In the schematic view, p-type GaN is used for the electron transit layer. With this on-state voltage control layer 9, the on-state voltage can be controlled as in the third embodiment. By using p-type GaN for the on-state voltage control layer 9, the on-state voltage is increased. By using n-type GaN, the on-state voltage is lowered. By intentionally increasing the on-state voltage, a low voltage equivalent to an on-state voltage can be achieved through forward bias application. The semiconductor device of this embodiment can have a function equivalent to that of a Zener diode. The semiconductor device of this embodiment also has the advantage that an equivalent of a Zener diode can be provided by a nitride semiconductor that does not easily provide a Zener diode.

(Fifth Embodiment)

Figure 7:
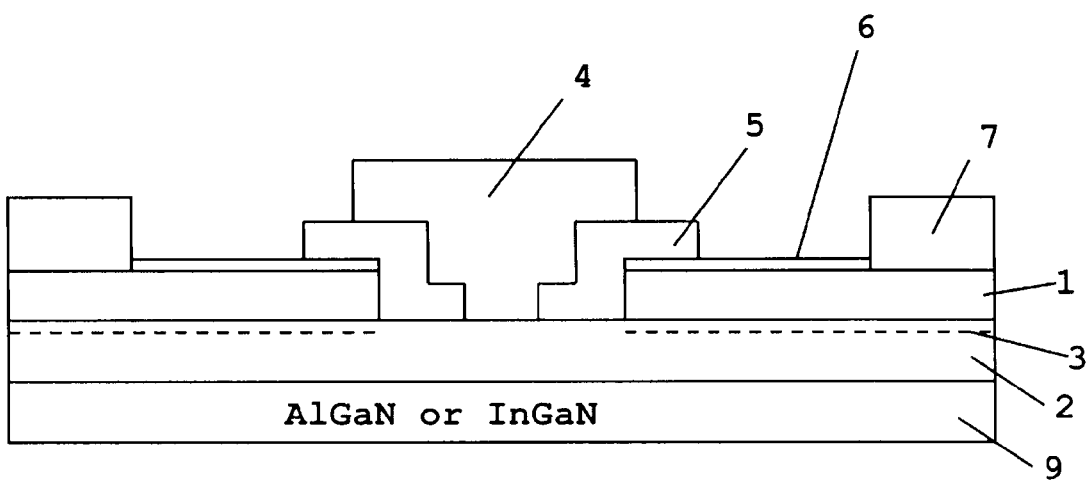
FIG. 7 is a schematic view of a semiconductor device according to an embodiment.

FIG. 7 is a schematic view of a semiconductor device according to a fifth embodiment. As the on-state voltage control layer 9, $Al_\alpha Ga_{1-\alpha}N$ ($0<\alpha\leq 1$) or $In_\beta Al_{1-\beta}N$ ($0\leq\beta\leq 1$) is used under the carrier transit layer 2. By using $Al_\alpha Ga_{1-\alpha}N$ ($0<\alpha\leq 1$) or $In_\beta Al_{1-\beta}N$ ($0\leq\beta\leq 1$) as the on-state voltage control layer 9, the energy state of the portion of the carrier transit layer 2 located immediately below the insulating film 5 is made higher, and the on-state voltage becomes higher. In this manner, the on-state voltage of the diode can be controlled. By intentionally increasing the on-state voltage, a low voltage equivalent to an on-state voltage can be achieved through forward bias application. This is equivalent to a Zener diode, and has the advantage that an equivalent of a Zener diode can be provided by a nitride semiconductor that does not easily provide a Zener diode.

(Sixth Embodiment)

Figure 8:
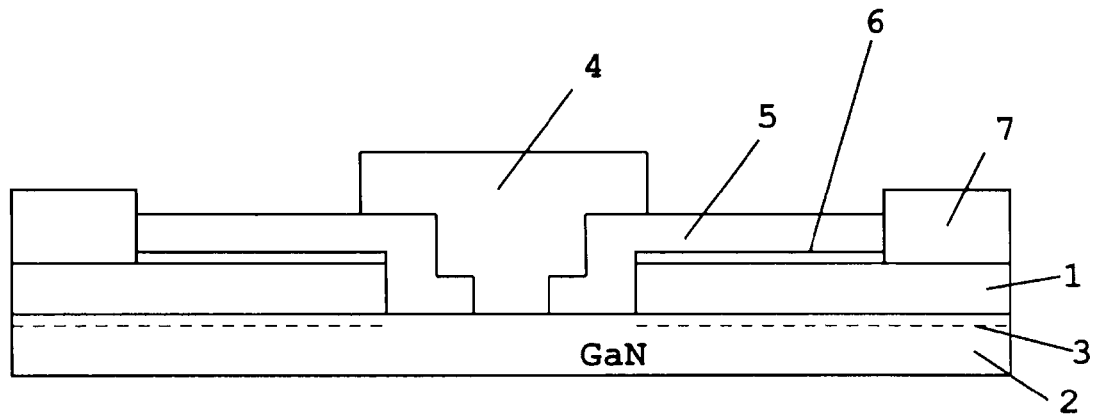
FIG. 8 is a schematic view of a semiconductor device according to another embodiment.

FIG. 8 is a schematic view of a semiconductor device according to a sixth embodiment. This embodiment differs from the first embodiment in that the insulating film 5 is formed to reach the cathode electrode 7. For convenience in manufacturing, the insulating film 5 may be formed not only around the anode electrode 4, as in the sixth embodiment.

(Seventh Embodiment)

Figure 9:
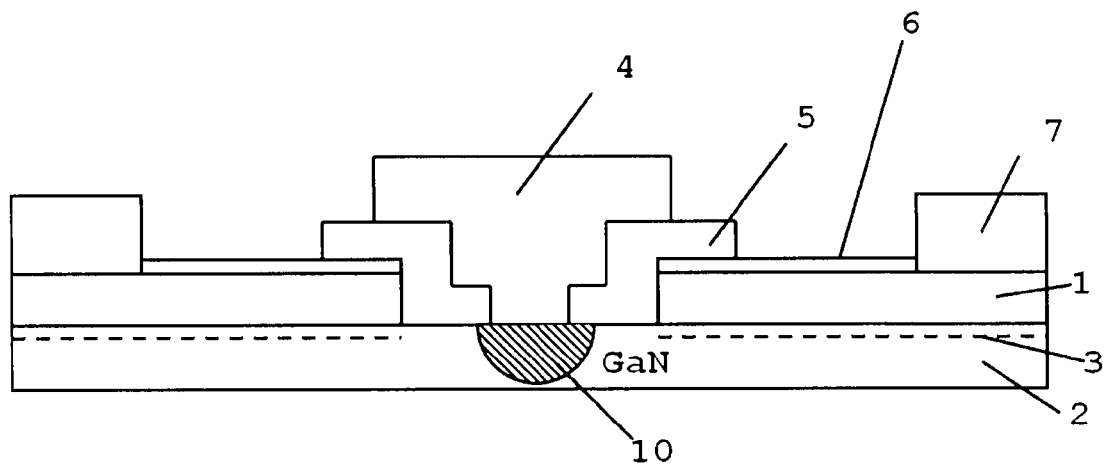
FIG. 9 is a schematic view of a semiconductor device according to yet another embodiment.

FIG. 9 is a schematic view illustrating a seventh embodiment. This embodiment differs from the first embodiment in that an n-type third semiconductor region 10 is formed in a portion of the carrier transit layer 2 located immediately below the anode electrode 4. The third semiconductor region 10 is formed through ion implantation, for example. The donor to be ion-implanted may be Si, for example. By forming an n-type electron transit layer (an ion implantation region 10) in the portion with which the anode electrode 4 forms an ohmic junction, the ohmic junction is improved, and the on-state resistance of the diode can be lowered. The ohmic junction can be improved where the concentration of the donor impurity is $1\times 10^{17}$ cm$^{-3}$ to $1\times 10^{20}$ cm$^{-3}$.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a first semiconductor layer made of $Al_x Ga_{1-x}N$ ($0<x<1$) or $In_y Al_{1-y}N$ ($0\leq y\leq 1$);
   a first semiconductor region, an insulating film, and an anode electrode that are formed on the same plane of the first semiconductor layer, and are made of undoped, n-type, or p-type GaN; and
   a cathode electrode formed on the first semiconductor region,
   the first semiconductor region, the insulating film, and the anode electrode being joined to the first semiconductor layer,
   the insulating film being joined to the first semiconductor layer between the first semiconductor region and the anode electrode,
   the junction between the anode electrode and the first semiconductor layer being an ohmic junction,
   the junction between the cathode electrode and the first semiconductor region being an ohmic junction.

2. The device according to claim 1, wherein the anode electrode is joined to the first semiconductor layer via a second semiconductor region.

3. The device according to claim 1, wherein a second semiconductor layer made of n- or p-type GaN, or $Al_\alpha Ga_{1-\alpha}N$ ($0<\alpha<1$) or $In_\beta Al_{1-\beta}N$ ($0<\beta<1$) is formed on a face of the first semiconductor layer on the opposite side from a face on which the first semiconductor region is formed.

4. The device according to claim 1, wherein an n-type third semiconductor region exists in a portion of the first semiconductor layer, the portion being located immediately below the anode electrode.

5. The device according to claim 1, wherein the insulating film is formed on the first semiconductor region, and the anode electrode is formed above a region in the first semiconductor region, the insulating film being formed on the region in the first semiconductor region.

6. The device according to claim 1, wherein an ion-implanted region exists in a portion of the first semiconductor layer, the portion being located below the anode electrode.

7. The device according to claim 1, which is a diode.

8. The device according to claim 3, which is a Zener diode.

9. The device according to claim 1, wherein the first semiconductor region is made of GaN, and an n- or p-type impurity concentration in the GaN is $1\times 10^{15}$ to $1\times 10^{18}$.

10. The device according to claim 6, wherein an impurity concentration in the ion-implanted region is $1\times 10^{17}$ cm$^{-3}$ to $1\times 10^{20}$ cm$^{-3}$.

* * * * *